United States Patent [19]
Pai et al.

[11] Patent Number: 5,627,010
[45] Date of Patent: May 6, 1997

[54] PHOTOIMAGEABLE RESIST COMPOSITIONS CONTAINING PHOTOBASE GENERATOR

[75] Inventors: Daniel Y. Pai, Millbury; Stephen S. Rodriguez, Monument Beach; Kevin J. Cheetham, Millbury; Gary S. Calabrese, North Andover; Roger F. Sinta, Woburn, all of Mass.

[73] Assignee: Shipley Company, L.L.C., Marlborough, Mass.

[21] Appl. No.: 228,187

[22] Filed: Apr. 15, 1994

Related U.S. Application Data

[63] Continuation of Ser. No. 836,789, Feb. 14, 1992, abandoned.

[51] Int. Cl.$^6$ .................... G03C 1/73; G03F 7/031; G03F 7/032
[52] U.S. Cl. .................... 430/270.1; 430/280.1; 430/281.1; 430/283.1; 522/65
[58] Field of Search .................... 430/270, 280, 430/283, 288, 270.1, 280.1, 283.1, 281.1; 522/65

[56] References Cited

U.S. PATENT DOCUMENTS

| | | | |
|---|---|---|---|
| 3,877,941 | 4/1975 | Lohmann | 96/48 R |
| 4,035,189 | 7/1977 | Hayashi et al. | 96/115 R |
| 4,299,911 | 11/1981 | Ochi et al. | 430/280 |
| 4,584,256 | 4/1986 | Ceintrey et al. | 430/161 |
| 4,789,623 | 12/1988 | Sato et al. | 430/203 |
| 4,849,320 | 7/1989 | Irving et al. | 430/280 |
| 4,950,581 | 8/1990 | Koike et al. | 430/283 |
| 4,975,471 | 12/1990 | Hayase et al. | 522/167 |
| 4,987,264 | 1/1991 | Holoch et al. | 568/33 |
| 5,055,378 | 10/1991 | Miyamura et al. | 430/280 |

FOREIGN PATENT DOCUMENTS

| | | |
|---|---|---|
| 0413087A1 | 2/1991 | European Pat. Off. . |
| 0425142A2 | 5/1991 | European Pat. Off. . |

OTHER PUBLICATIONS

*Chemical and Engineering News*, pp. 24–25 (Apr. 29, 1991).
J. Cameron et al, *J. Am. Chem. Soc.*, vol. 113, No. 11, 4303–4313 (1991).
J. Cameron et al, *J. Org. Chem.*, 55, 5919–5922 (1990).
M. Winkle et al, *Journal of Photopolymer Science and Technology*, vol. 3, No. 3, 419–422 (1990).
C. Kutal et al, *Journal of Coatings Technology*, vol. 62, No. 786, 63–67 (Jul. 1990).
H. Stenzenberger, *British Polymer Journal*, 20, 383–396 (1988).
R. Cummings et al, *Tetr. Letters*, vol. 29, No. 1, 65–68 (1988).
I. Varma, *Polymer News*, vol. 12, No. 10, 294–306 (1987).
B. Amit, *J. Org. Chem.*, vol. 39, No. 2, 192–196 (1974).
A. Patchornik et al, *J. Am. Chem. Soc.*, 92:21, 6333–6335 (1970).
J. Barltrop et al, *J. Chem. Soc. Chem. Comm.*, 822–823 (1966).
*Chem. Abstracts*, Photochemistry, 116:13374p (Issue I, 1992).
Kutal et al, *Proc. Polym. Mat. Sci. Eng.*, 61, 195–198 (1989).
Frechet et al, *J. Polym. Mat. Sci. Eng.*, 64, 55–56 (Spring 1991).
Kutal et al, *J. Electrochem. Soc.*, vol. 134, No. 9, 2280–2285 (1987).
Beecher et al, *J. Poly. Mater. Sci. Eng.*, 64, 71–72 (1991).

*Primary Examiner*—Susan W. Berman
*Attorney, Agent, or Firm*—Robert L. Goldberg

[57] ABSTRACT

A radiation sensitive composition, process for using said composition, and substrates coated with said composition. The photoimageable composition comprises a photobase generator compound, a resin binder and a material capable of crosslinking in the presence of base. In preferred aspects, the invention provides a negative-acting, aqueous developable photoimageable composition comprising a photobase generator compound, a resin binder which preferably is a phenolic polymer, a crosslinking agent that comprises one or more active groups that will undergo base-initiated crosslinking, and a curing agent.

36 Claims, No Drawings

PHOTOIMAGEABLE RESIST COMPOSITIONS CONTAINING PHOTOBASE GENERATOR

This is a continuation application Ser. No. 07/836,789 filed on Feb. 14, 1992 now abandoned.

BACKGROUND OF THE INVENTION

1. Introduction

The invention relates to radiation sensitive compositions and, more particularly, to photoimageable compositions useful as soldermasks in the manufacture of printed circuit boards.

2. Background Art

Soldermasks, also known as solder resists, are compositions used to mask off a portion of a printed circuit board and prevent those areas from accepting solder during solder processing. See Coombs, *Printed Circuits Handbook*, ch. 16, McGraw Hill (3rd ed., 1988), incorporated herein by reference for its teaching of soldermasks and use thereof.

For years, screen printing was the means used to apply a soldermask to a substrate in the manufacture of printed circuit boards. It was a desired process because it permitted selection of masking materials for a variety of resins in the formulation of the soldermask and enabled one to apply a heavy coating on an uneven surface with a reasonable degree of accuracy. However, increased packing of conductor tracks and reduced track widths resulted in a demand for greater dimensional accuracy and resolution of features beyond the resolution capability of conventional screen printing masks.

A first step towards the formulation of a photoimageable soldermask was the introduction of screen printed photopolymerizable soldermasks utilizing acrylate resins. However, such photopolymerizable soldermasks generally did not gain significant market acceptance.

A next step in the evolution of soldermasks was the introduction of photoimageable soldermasks analogous to the photoimageable photoresists used in printed circuit board manufacture to define a desired conductor pattern. These photoimageable solder resists were generally solvent developable and employed acrylate-based resins. Two primary processes were used to apply these photoimageable soldermasks to a circuit substrate. One was as a dry film soldermask using a laminator to apply heat and pressure to the soldermask as it was applied to the circuit board substrate. The other method used a liquid soldermask, typically applied by means of screen or curtain coating equipment. Both processes possessed advantages and disadvantages. Disadvantages common to both included use of organic solvent development which can present disposal and other problems; poor to moderate adhesion to copper; and limited resistance to elevated temperatures. Poor adhesion to copper can result in delamination of the soldermask from the copper conductors during the soldering operation. Inadequate thermal resistance can result in deformation of the mask during soldering. Further, it was often difficult to generate fine lines of these solvent-developable solder resists.

More recently, aqueous developable soldermask compositions have been reported. These soldermasks are generally applied as a wet coating, such as by curtain coating, dried, exposed, and developed, typically with an aqueous alkaline solution.

Difficulties have been encountered in efforts to provide suitable aqueous developable photoimageable soldermask compositions. For example, shortcomings of prior aqueous developable photoimageable soldermasks have included failure to yield high resolution relief images upon development, reduced adhesion of composition coating layers to copper at elevated temperatures, poor thermal properties and/or poor resistance to processing chemicals such as fluxes.

It thus would be desirable to have a new photoimageable resist composition. It would be further desirable to have a new photoimageable composition that was aqueous developable. It would be still further desirable to have a photoimageable, aqueous developable composition that could be used as a soldermask.

In European Patent Application 0 425 142 A2, publication date Feb. 5, 1991, a positive-acting photoresist composition is reported which is said to contain at least one film-forming acid-hardening resin system, an acid or acid-generating material, preferably in the form of a thermal acid generator, and a photobase-generating compound. The radiation sensitive compositions of the present invention differ from this reported positive photoresist. For example, the compositions of the present invention suitably can be free or substantially free of an acid and/or acid-generating material.

SUMMARY OF THE INVENTION

The present invention provides novel radiation sensitive coating compositions. Applications of the compositions of the invention include use as a photoimageable, aqueous developable soldermask. The invention is based in part upon the discovery of using a photoactivated base generator compound to provide crosslinking of one or more polymerizable components of certain compositions.

In general, the radiation sensitive compositions of the invention contain a photobase generator and one or more materials that crosslink, cure or harden upon exposure to activating radiation and generation of base. For example, a suitable composition comprises a resin binder and a material that is capable of crosslinking in the presence of base. As employed in the compositions of the invention, a material capable of crosslinking in the presence of base in sometimes referred to herein as "the crosslinker material". The resin binder preferably imparts aqueous developability to the composition and is suitably a phenolic resin, such as a novolak resin, a poly(vinylphenol) resin or a resin that comprises both phenolic and cyclic alcohol units. Other suitable resin binders include acrylate resins, acrylate/phenol copolymers and blends of phenolic resins and acrylate-based resins. The crosslinking agent of the composition is suitably a monomer, oligomer or polymer that comprises at least one active group, and preferably contains at least two active groups, that are capable of undergoing base-initiated crosslinking. These active functionalities of the crosslinker material preferably are selected from the group of an epoxy and an electrophilic multiple bond, e.g., a maleimide functionality. The composition preferably further comprises a curing agent such as a melamine resin or an allyl phenol. The compositions of the invention also may contain other additives such as fillers, dyes, and photosensitizers. The compositions of the invention are suitable for use as a liquid coating composition as well as a dry film.

It has been found that the compositions of the invention can form a crosslinked network upon exposure to activating radiation without any type of post exposure bake. That is, the base generated during exposure can be sufficiently active to induce, at room temperatures, a crosslinking reaction between polymerizable components of the composition.

This is in contrast to photoacid-generating compositions which generally require heating of the exposed composition layer to induce an acid-catalyzed crosslinking reaction. If desired, a coating layer of a composition of the invention also can be baked after exposure and prior to development.

A particularly preferred composition of the invention comprises a phenolic resin binder, a photobase generator, an epoxy-containing crosslinker and preferably a curing agent, preferably a melamine curing agent, or a mixture of a melamine and an allyl phenol. Another particularly preferred composition of the invention comprises a phenolic resin binder, a photobase generator, a crosslinker that contains one or more electrophilic multiple bonds such as a bismaleimide, and preferalbly a curing agent, preferably an allyl phenol curing agent, or a mixture of an allyl phenol and a melamine.

The invention also includes processes for using the compositions of the invention, including methods for forming a relief image on a substrate and processes for forming an imaged dielectric layer on a printed circuit board having a pattern of copper conductor paths on its surface. The invention further provides novel articles of manufacture comprising substrates (including printed circuit boards) coated with the compositions of the invention.

The terms "crosslink" and "crosslinking" as used herein refer to any reaction of components of a composition of the invention that results in reduced developer solubility of the composition.

DETAILED DESCRIPTION OF THE INVENTION

The resin binder of the compositions of invention suitably can comprise a wide range of materials, for example, compounds that contain reactive hydrogen groups and, preferably, can impart aqueous developability to the composition. Thus, suitable resin binders include resins that contain polar functional groups, such as hydroxyl or carboxylate, that can impart aqueous developability to the composition. Further, such binders are preferably employed in a composition in a concentration sufficient to render unexposed portions of a coating layer of the composition developable with an aqueous-based solution including alkaline aqueous solutions. A phenolic resin binder is generally preferred. Exemplary phenolic resins include, for example, phenol aldehyde condensates known in the art as the novolak resins, homo and copolymers of alkenyl phenols and homo and copolymers of N-hydroxyphenyl-maleimides.

Of the phenolic resins suitable for purposes of the invention, the phenol formaldehyde novolaks are preferred materials as the novolaks are able to form an aqueous developable, photoimageable coating composition. These resins are made following procedures known and disclosed in numerous publications such as DeForest, *Photoresist Materials and Processes*, McGraw-Hill Book Company, New York, Ch. 2, 1975; Moreau, *Semiconductor Lithography Principles, Practices and Materials*, Plenum Press, New York, Chs. 2 and 4, 1988; and Knop and Pilato, *Phenolic Resins*, Springer-Verlag, 1985, all said publications incorporated herein by reference.

More particularly, novolak resins are the thermoplastic condensation product of a phenol and an aidehyde. Examples of suitable phenols for condensation with an aidehyde, especially formaldehyde, for the formation of novolak resins, include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in the formation of a suitable novolak resin which may vary in molecular weight from about 500 to 100,000 daltons. Preferred novolak resins include the cresol formaldehyde condensation products.

Another particularly suitable binder for the compositions of the invention are poly(vinylphenol) resins. Poly (vinylphenols) are thermoplastic materials that may be formed by block polymerization, emulsion polymerization or solution polymerization of corresponding monomers in the presence of a cationic catalyst. Vinylphenols used for production of poly(vinylphenol) resins may be prepared, for example, by hydrolysis of commercially available coumarins or substituted coumarins, followed by decarboxylation of the resulting hydroxy cinnamic acids. Useful vinyl phenols may also be prepared by dehydration of the corresponding hydroxy alkyl phenol or by decarboxylation of hydroxy cinnamic acids resulting from the reaction of substituted or non-substituted hydroxy benzaldehydes with malonic acid. Preferred poly(vinylphenol) resins prepared from such vinyl phenols have a molecular weight range of from about 2,000 to about 100,000 daltons. Procedures for the formation of poly(vinylphenol) resins also can be found in U.S. Pat. No. 4,439,516, incorporated herein by reference.

Another preferred phenolic resin binder for the compositions of the invention are copolymers of phenols and non-aromatic cyclic alcohols analogous in structure to the novolak resins and poly(vinylphenol) resins. Such copolymers provide a radiation sensitive composition with relatively greater transparency to activating radiation, and are described in U.S. Pat. No. 5,128,232, incorporated herein by reference. These copolymers may be formed in several ways. For example, in the conventional preparation of a poly(vinylphenol) resin, a cyclic alcohol may be added to the reaction mixture as a comonomer during polymerization reaction which is thereafter carried out in a normal manner. The cyclic alcohol is preferably aliphatic, but may contain one or two double bonds. The cyclic alcohol is preferably one closest in structure to the phenol. For example, if the resin is a poly(vinylphenol), the comonomer would be vinyl cyclohexanol.

The preferred method for formation of the copolymer comprises hydrogenation of a preformed novolak resin or a preformed poly(vinylphenol) resin. Hydrogenation may be carried out using art recognized hydrogenation procedures, for example, by passing a solution of the phenolic resin over a reducing catalyst such as a platinum or palladium coated carbon substrate or preferably over Raney nickel at elevated temperature and pressure. The specific conditions are dependent upon the polymer to be hydrogenated. More particularly, the polymer is dissolved in a suitable solvent such as ethyl alcohol or acetic acid, and then the solution is contacted with a finely divided Raney nickel catalyst and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units randomly interspersed in the polymer in percentages dependent upon the reaction conditions used.

The mole percentage of cyclic alcohol units of the polymer should not exceed a level where development of the composition is prevented following exposure of the resist to activating radiation. Thus, preferably the polymer has a major proportion of phenolic units and a minor proportion of cyclic alcohol units, more preferably the cyclic alcohol units vary from about 1 to 30 mole percent of the polymer binder, and still more preferably from about 5 to 15 mole percent of the polymer.

An additional class of suitable phenolic resins include homo and copolymers of N-hydroxyphenyl maleimides. Such materials are disclosed in European Published Application No. 0,255,989 beginning on page 2, line 45 and continuing to page 5, line 51, incorporated herein by reference for its teaching of such resins.

As noted, in addition to phenolic polymers, other materials can be employed as a resin binder for the compositions of the invention. In particular, acrylate-based resins can be employed. Suitable acrylate resins can be prepared by known methods, for example copolymerizing alpha,beta-ethylenically unsaturated acids, such as acrylic acid and methacrylic acid, with unsaturated monomers, e.g., methacrylate esters such as methyl methacrylate, ethyl methacrylate, etc., or other monomers such as styrene. Polymers comprising both phenolic units and acrylate units also will be suitable resins binders. Such polymers can be prepared, for example, by polymerization of vinylphenol or substituted vinylphenol with alpha,beta-ethylenically unsaturated acids such acrylic and methacrylic acids.

Additionally, resin blends can be employed as the resin binder system of the compositions of the invention. For example, a blend of one or more of the above described phenolic resins and acrylate-based resins will be suitable, preferably admixed in a ratio and used in a concentration sufficient to impart aqueous developability to the composition.

The second component of the radiation sensitive compositions of the invention is one or more materials capable of crosslinking in the presence of base. For example, in the presence of base a crosslinker could react with other crosslinkers, the resin binder and/or the photogenerated base of the composition. The crosslinker material is suitably a monomer, oligomer or polymer that comprises at least one active group, and preferably contains at least two active groups, wherein said active groups are capable of undergoing base-initiated crosslinking with reactive components of the composition. Preferred active group(s) of the crosslinker material are epoxy functionalities and electrophilic multiple bonds. A blend of different crosslinkers may be suitably employed in the compositions of the invention.

Epoxy containing materials are any organic compounds having one or more expoxy groups (i.e., one or more oxirane rings) polymerizable by ring opening. Such materials, broadly called epoxides, include monomeric epoxy compounds, oligomeric compounds and polymeric epoxides that may be aliphatic, cycloaliphatic, aromatic or heterocyclic. Preferred materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer or copolymer). The epoxides may be pure compounds or may be mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Illustrative of suitable substituents include halogens, ester groups, ethers, sulfonate groups, siloxane groups, nitro groups, phosphate groups, etc.

Further epoxy containing materials useful in the practice of this invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Further examples of epoxides of this type are described in U.S. Pat. No. 3,018, 262, incorporated herein by reference.

There are many commercially available epoxy containing materials which can be used in the compositions of the invention. In particular, epoxides which are readily available include epichlorohydrin, glycidol, glycidylmethacrylate, the glycidyl ether of p-tertiarybutylphenol (e.g., those available under the trade designation "Epi-Rez" 5014 from Celanese); diglycidyl ether of Bisphenol A (e.g., those available under the trade designations "Epon 828," "Epon 1004" and "Epon 1010" from Shell Chemical Co.; and "DER-331," "DER-332" and "DER-334" from Dow Chemical Co.), vinylcyclohexene dioxide (e.g., "ERL-4206" from Union Carbide Corp.), 3,4-epoxy-6-methyl-cyclohexylmethyl-3,4-epoxy-6-methylcyclohexene carboxylate (e.g., "ERL-4201" from Union Carbide Corp.), bis(3,4-epoxy-6-methylcyclohexylmethyl) adipate (e.g., "ERL-4289" from Union Carbide Corp.), bis(2,3-epoxycyclopentyl) ether (e.g., "ERL-0400" from Union Carbide Corp.), aliphatic epoxy modified with polypropylene glycol (e.g., "Erl-4050" and "ERL-4269" from Union Carbide Corp.), dipentene dioxide (e.g., "ERL-4269" from Union Carbide Corp.), epoxidized polybutadiene (e.g., "Oxiron 2001" from FMC Corp.), flame retardant epoxy resins (e.g., "DER-580," a brominated bisphenol type epoxy resin available from Dow Chemical Co.), 1,4-butanediol diglycidyl ether of phenol-formaldehyde novolak (e.g., "DEN-431" and "DEN-438" from Dow Chemical Co.), and resorcinol diglycidyl ether (e.g., "Kopoxite" from Koppers Company, Inc.).

As noted above, preferred active groups of the crosslinker material of the compositions of the invention include electrophilic multiple bonds, such as maleimides, alpha,beta-unsaturated ketones, esters, amides, nitriles and other alpha, beta-unsaturated electron-withdrawing groups. Typically the electrophilic multiple bond will be a carbon-carbon double bond activated by one or more electron-withdrawing substituents, although activated acetylenes can also function as the electrophilic species. Preferred is a crosslinker that comprises two or more electrophilic multiple bonds. Particularly preferred are those active groups that comprise a carbon-carbon multiple bond that is stabilized by two electron-withdrawing substituents such as malonate esters or beta-keto esters or, preferably, maleimide groups. These Michael acceptors can undergo a base-initiated reaction with a suitable nucleophile. For example, in the compositions of the invention, the above described phenolic resin binders and/or the photoactivated base can undergo addition with these crosslinker materials that contain an electrophilic multiple bond.

Particularly preferred crosslinking materials that contain an electrophilic multiple bond include a crosslinker that contains one or more maleimide groups, and specifically preferred are bismaleimides of the following formula (I):

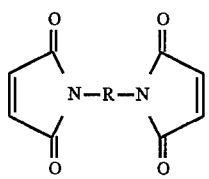

(I)

wherein R is selected from the group consisting of substituted or unsubstituted aryl, substituted or unsubstituted alkyl, or a group of the formula $R^1$—Ar—$R^2$—Ar'—$R^3$, where $R^1$, $R^2$ and $R^3$ are independently selected from the group consisting of a substituted or unsubstituted alkyl, and Ar and Ar' are each independently selected from the group constituting of substituted or unsubstituted aryl. Said substituted aryl and alkyl groups of the compounds of formula (I) are suitably substituted by one or more functionalities such as, for example, halogen, alkoxy (such as methoxy, ethoxy, etc.), aryl and alkyl. Said substituted and unsubstituted alkyl groups of formula (I) preferably have from 1 to 8 carbon atoms, more preferably 1 to 4 carbon atoms. Aryl groups are preferably phenyl. A specifically preferred compound of formula (I) is 1,1'-(methylenedi-1,4-phenylene) bismaleimide.

A number of suitable maleimides, including bismaleimides of formula (I) are commercially available. For example, suitable maleimides are available from Kennedy and Klim, Inc. of Little Silver, N.J. Other suitable maleimides can be readily synthesized by known procedures, for example by thermal or acidic condensation of maleic anhydride with a compound of a structure corresponding to $R(NH_2)_2$, where R is the same as defined above in reference to formula (I). See, I. Varma, et al., *Polymer News*, vol. 12, 294–306 (1987), incorporated herein by reference.

Resins that contain electrophilic multiple bonds, or that contain both epoxy and electrophilic multiple bonds, also can be suitably employed as the crosslinking material in the compositions of the invention. Many suitable resins are commercially available, such as the bismaleimide resins available under the tradename Kerimid by Rhone-Poulenc, and Thermax MB-8000 available from Kennedy and Klim, Inc. Suitable maleimide resins are also described in the above incorporated article of I. Varma, et al., and in U.S. Pat. No. 4,987,264, incorporated herein by reference.

As noted, the compositions of the invention also contain a photobase generator compound which photodecomposes (e.g., undergoes photocleavage) to provide a base upon exposure to activating radiation. A base generator typically will be a neutral compound that generates base (e.g., an organic base such as an amine) upon photoactivation. The base generator should be present in a composition of the invention in an amount sufficient to enable development of a coating layer of the composition following exposure of the same to activating radiation. A variety of base generator compounds will be suitable for use in the compositions of the invention. Suitable base generators include organic compounds, for example, photoactive carbamates including benzyl carbamates and benzoin carbamates. Other suitable organic base generators include O-carbamoylhydroxylamines, O-carbamoyloximes, aromatic sulfonamides, alpha-lactams, amides such N-(2-arylethyenyl)amides, and other amides. More specifically, suitable O-carbamoylhydroxylamines include compounds of the formula $RR^1OC(=O)NR^2R^3$ where R and $R^1$ are independently alkyl, aryl or acyl, $R^2$ is hydrogen or alkyl and $R^3$ is alkyl or aryl. Suitable O-carbamoyloximes include compounds of the formula $RR^1C(=N)OC(=O)NR^2R^3$ where R and $R^1$ are independently hydrogen, alkyl or aryl, $R^2$ is alkyl or aryl and $R^3$ is hydrogen or alkyl. Suitable sulfonamides include compounds of the formula $ArS(=O)_2NRR^1$ where Ar is an aryl group, R is hydrogen or alkyl and $R^1$ is alkyl or aryl. Suitable alpha-lactams include compounds of the formula (II):

where R is alkyl or aryl and $R^1$ is alkyl or aryl. Suitable; N-(2-arylethyenyl)amides include compounds of the structure $RC(=O)N(R^1)CH=CHAr$ where Ar is an aryl group, R is alkyl or aryl. and $R^1$ is alkyl. Other amides also will be suitable, for example formanilide and other aryl substituted amides. In the above described formulas, aryl is typically phenyl. As referred to in the above formulas, an alkyl group may be of a straight chain or branched configuration, or comprise a cyclic structure, and typically contains from 1 to 15 carbon atoms, more typically from 1 to 6 carbon atoms. An alkyl group is suitably either unsubstituted or substituted at one or more available positions. The substituents may be, for example, halo, aryl, or alkyl. Similarly, an aryl group also may be unsubstituted or substituted at one or more available positions by, for example, halo, aryl or alkyl.

Specifically preferred organic base generators include 2-hydroxy-2-phenylacetophenone N-cyclohexyl carbamate [i.e., $(C_6H_5C(=O)CH(C_6H_5)OC(=O)NH\ C_6H_{11}]$, o-nitrobenzyl N-cyclohexyl carbamate [i.e., $o\text{-}NO_2C_6H_5CH_2OC(=O)NHC_6H_{11}$], N-cyclohexyl-2-naphthalene sulfonamide [i.e., $C_{10}H_7SO_2NHC_6H_{11}$, 3,5-dimethoxybenzyl N-cyclohexyl carbamate [i.e., $(CH_3O)_2C_6H_5CH_2OC(=O)NHC_6H_{11}$], N-cyclohexyl p-toluene sulfonamide [i.e., $p\text{-}CH_3C_6H_5SO_2NHC_6H_{11}$], and dibenzoin isophorone dicarbamate.

Metal coordination complexes that generate base upon exposure to activating radiation also will be suitable, such as the cobalt (III) complexes described in *J. Coatings Tech.*, 62, no. 786, 63–67 (July 1990), incorporated herein by reference for its teaching of the preparation and use of said complexes. The described photoactive materials include compounds of the formula $Co(NH_2R)_5X^{n+}$ where R is hydrogen, methyl or n-propyl, X is $Cl^-$, $Br^-$, $I^-$ or other negative groups when n=2; and X is $RNH_2$ or $H_2O$ when n=3, and a suitable counterion chosen to impart the desired solubility. Suitable counterions may include, for example, $Cl^-$, $Br^-$ or $ClO_4^-$. Additionally, other metal coordination complexes that generate base upon exposure to activating radiation will be suitable photobase generators for use in the compositions of the invention.

Preparation of photobase generator compounds is known in the art. For example, suitable benzyl carbamates can be prepared by the reaction of a diisocyanate with a benzyl alcohol in the presence of a suitable catalyst. Thus dibenzoin isophorone dicarbamate is prepared by reaction of benzoin with isophorone diisocyanate in a suitable solvent, typically with heating, and in the presence of a suitable catalyst such as methyllithium. Suitable solvents; include ether and tetrahydrofuran. Photoactivation of this base generator provides isophoronediamine. See J. Cameron et al., *J. Am. Chem. Soc.*, vol. 113, no. 11, 4303–4313 (1991); J. Cameron et al., *J. Polym. Mater. Sci. Eng.*, 64, 55 (1991); and J. Cameron, et al., *J. Org. Chem.*, 55, 5919–5922 (1990), all of which are incorporated herein by reference for their teaching of preparation of photobase generators. Ortho-nitrobenzyl N-cyclohexylcarbamate can be prepared by reaction of cyclohexylisocyanate and 2-nitrobenzyl alcohol in a heated toluene solution until reaction completion. Thin layer chromatography can be employed to monitor progress of the reaction. Suitable reaction temperatures include temperatures at or about 110° C. See European Patent Application 0425 142 A2, publication date Feb. 5, 1991, incorporated herein by reference for its teaching of photobase generators and the preparation thereof. The synthesis of sulfonamides is well known and generally involves reaction of a sulfonyl chloride with an amine. Thus N-cyclohexyl p-toluene sulfonamide is prepared by reaction of p-toluenesulfonyl chloride and cyclohexyl amine in a suitable solvent with heating. Suitable solvents; include for example tetrahydrofuran and toluene. A photoactive polymer may also be prepared and used in the compositions of the invention as the photobase generator component. For example, a polymer containing pendant photoactive carbamate groups can be employed. Such a polymer can be prepared by adding a tetrahydrofuran solution of a catalytic amount of 4-dimethylaminopyridine and triethylamine to a mixture of o-nitrobenzyloxycarbonyl chloride and p-aminostyrene. Upon reaction completion, the reaction product can be purified by standard means, for example flash column chromatography, to yield the o-nitrobenzyloxycarbonyl carbamate of p-aminostyrene. Other polymers will undergo similar reaction with a benzyl carbonyl chloride, for example copolymers such as poly(p-aminostyrene-co-styrene) and poly(p-aminostyrene-co-methyl methacrylate).

An optional but particularly preferred additional component of the photoimageable compositions of the invention is a curing agent. A preferred curing agent is an amine-based material such as a melamine monomer, oligomer or polymer, and other amine-based curing agents known to those skilled in the art. Particularly preferred melamine curing agents include melamine formaldehyde resins which are formed by condensation of formaldehyde with melamine. These resins are typically ethers such as trialkylol melamine and hexaalkylol melamine. The alkyl group may have from 1 to as many as 8 or more carbon atoms but is preferably methyl. Dependent upon the reaction conditions and the concentration of formaldehyde, the methyl ethers may react with each other to form more complex units. It is particularly preferred to use a melamine resin curing agent with a composition that comprises an epoxide crosslinker.

Suitable melamine resins are commercially available from American Cyanamid Company of Wayne, N.J. under the trade name Cymel. In accordance with the present invention, the preferred melamine formaldehyde resin has a degree of polymerization varying between 1.3 and 2.0 and most preferably, is a member of the Cymel 300 Resin series (available from American Cyanamid) which are highly methylated melamine formaldehyde resins. Particularly preferred melamine formaldehyde resins are hexamethoxymethyl melamines, preferably with a low methylol content having alkoxy groups as the principle reactive groups such as the Cymel 300 and Cymel 301 resins available from American Cyanamid.

Another suitable curing agent is an aromatic compound that contains one or more allyl substituents (i.e., the aromatic compound is substituted at one or more ring positions by the allylic carbon of an alkylene group). Suitable allyl aromatics include allyl phenyl compounds. More preferred is an allyl phenol compound. An allyl phenol curing agent can be a monomer, oligomer or polymer that contains one or more phenol units where the phenol units are substituted at one or more ring positions by an allylic carbon of an alkylene group. Typically the alkylene substituent(s) is propenyl, i.e., the phenol has one or more propenyl substitutents.

An allyl phenol curing agent is preferably employed with a crosslinker that contains an electrophilic multiple bond, for example a maleimide crosslinker. Particularly preferred is a composition that contains a crosslinker that comprises one or more maleimide groups and an allyl phenol curing agent. Suitable allyl phenols include a polycondensate of phenol and hydroxybenzaldehyde and an allylhalide such as allylchloride. A number of suitable allyl phenols are commercially available, for example the allyl phenol sold under the trade name Thermax SH-150AR by Kennedy and Klim, Inc. (Little Silver, N.J.). Allyl phenyl compounds including allyl phenols and the use thereof are also described in above incorporated U.S. Pat. No. 4,987,264, and in H. Stenzenberger, *British Polymer Journal*, 20, 383–386 (1988), incorporated herein by reference.

To enable development of a good quality relief image, preferably a curing agent (or any other components of the composition) does not substantially crosslink in unexposed regions of a coating layer of a photoimageable composition of the invention prior to development. Thus, if a heat treatment is employed]prior to exposure, or a heat treatment is employed after exposure and prior to development, preferably such heat treatments do not cause a crosslinking reaction in unexposed regions of a coating layer of the composition to an extent where development and resolution of the relief image are compromised to an undesirable extent.

Other additives may be optionally included in the compositions of the invention such as dyes, fillers, wettings agents, fire retardants and the like. Photosensitizers constitute a preferred additive for purposes of the invention and are added to the composition to expand or enhance a composition's spectral response. Suitable photosensitizers include, for example, 2-ethyl-9,10-dimethoxyanthracene, 9,10-dichloroanthracene, 9,10-phenylanthracene, 1-chloroanthracene, 2-methylanthracene, 9-methylanthracene, 2-t-butylanthracene, anthracene, 1,2-benzanthracene, 1,2,3,4-dibenzanthracene, 1,2,5,6-dibenzanthracene, 1,2,7,8-dibenzanthracene, 9,10-dimethoxydimethylanthracene, and the like. Other suitable photosensitizers include those disclosed in European Patent Application 0423446, incorporated herein by reference. Preferred photosensitizers include 2-ethyl-9,10-dimethoxyanthracene, N-methylphenothiazine, and isopropylthioxanthone. Photosensitizers can be employed in a composition within relatively wide concentration ranges, for example between about 0.5 to 5 weight percent of the total weight of the composition's dry components.

The concentration of the components of the compositions of the invention may vary within relatively wide limits dependent upon the use of the material. Concentration ranges for the principal ingredients of the compositions of the invention are set forth in Table 1 below and expressed in weight percents based on total dry components of the composition. As used herein, the term dry components of a composition refers to all components of the composition other than the solvent carrier.

TABLE 1

|  | Suitable Range | Preferred Range |
| --- | --- | --- |
| Resin Binder | 25 to 90 | 35 to 85 |
| Crosslinker Material | 3 to 50 | 30 to 40 |
| Photobase Generator | 1 to 50 | 1 to 15 |

If a curing agent is employed in a composition, suitable and preferred concentrations of components of a composition of the invention are set forth in Table 2 below and expressed as weight percents based on total dry components of the composition.

TABLE 2

|  | Suitable Range | Preferred Range |
| --- | --- | --- |
| Resin Binder | 25 to 70 | 30 to 60 |
| Crosslinker Material | 3 to 50 | 30 to 40 |
| Curing Agent | 1 to 35 | 1 to 20 |
| Photobase Generator | 1 to 50 | 1 to 15 |

In addition to the above components, other additives are commonly found in such compositions as described above. Such materials would be present in minor concentration except for fillers and dyes which may be present in large concentration such as, for example, in amounts of from 5 to 30 percent by weight of the total of the composition's dry components.

To make a liquid coating composition, the components of the composition are dissolved or dispersed in a suitable solvent such as, for example, one or more of the glycol ethers such as ethylene glycol monomethyl ether; esters such as a methyl cellosolve acetate, ethyl cellosolve acetate, propylene glycol monomethyl ether acetate, dipropylene glycol monomethyl ether acetate and other solvents such as dibasic esters, propylene carbonate, gamma-butyrolactone and N-methyl pyrrolidinone.

The concentration of the dry components in the solvent will depend on several factors such as the method of application to a substrate. For example, the concentration of the dry components in a slot coating composition may be higher than in a curtain coating composition. In general, the concentration of the dry components in the solvent may vary from about 10 to 50 weight percent or more of the total weight of the coating composition. More specifically for the case of a curtain coating composition, the percentage may vary between about 40 to 45 weight percent of the total composition.

The compositions of the invention may also be used to form a dry film resist. A dry film resist is typically produced by coating the liquid coating composition onto a suitable support such as a polyolefin film and then covering the resist film with a thin polymer film, for example a polyester film. The thin film is peeled away prior to use and the solid resist layer is applied to a substrate surface. See, W. Deforest, *Photoresist Materials and Processes*, (McGraw Hill 1975), incorporated herein by reference.

Using a method for forming a printed circuit board for purposes of exemplification, a radiation sensitive composition of the invention may be applied to a substrate having a pattern of conductive material disposed thereon. The substrate may be a copper laminate substrate prepared by the methods described in Coombs, *Printed Circuits Handbook*, McGraw-Hill, (3rd ed, 1988), incorporated herein by reference. Other suitable substrates; include those prepared by laminating multilayer boards for the manufacture of printed circuit boards with vias (through-holes) and interconnections which may contain solder, as described in the above incorporated Printed Circuits Handbook.

The radiation sensitive compositions may be coated onto the substrate using conventional techniques including screen printing, curtain coating, roller coating, slot coating, spin coating, flood coating, electrostatic spray, spray coating, dip coating, electrodeposition and as a dry film. As indicated above, the viscosity of the composition may be adjusted to meet the requirements for each method of application by adding additional solvent for methods requiring low viscosity or thickening agents and fillers for methods requiring high viscosity.

After coating, the composition layer is suitably dried at 80° to 100° C. for a total drying time of 10 to 60 minutes to remove solvent. If the composition contains a curing agent, it is desirable to avoid temperatures during this drying step in excess of 100° C. and drying times of more than 60 minutes to prevent premature crosslinking of the composition. Premature crosslinking may result in a loss in developer selectivity between exposed and unexposed areas.

The process of transferring a desired image to the photoimageable layer is well known in the art and involves exposing the layer through a phototool to a source of activating radiation to initiate generation of base in the exposed area. Suitable sources of activating radiation include an ultraviolet light source, electron beam or x-rays. The photogenerated base initiates a reaction between reactive component(s) of the composition.

As noted, in contrast to prior compositions that employ acid-catalyzed crosslinking, the compositions of the invention may not require post-exposure heating to induce crosslinking of component(s) of the composition. It has been found that the photogenerated base can be sufficiently reactive to induce a crosslinking reaction in exposed regions of a coating layer at the ambient temperatures of the exposure step (e.g., at about room temperature). That is, a coating layer of the composition of the invention can be exposed and developed to provide a relief image in the absence of any post-exposure bake.

While not necessarily required to crosslink the composition's polymerizable components, the imaged coating layer of the composition may be baked after exposure and prior to development to promote or enhance crosslinking in exposed areas. Suitable post exposure bake conditions comprise heating to about 85° to 100° C. for between about 10 to 30 minutes.

It has been found that a crosslinked coating layer of a composition of the invention typically has the unexpected property of relatively high flexibility. This is in contrast to at least some acid-based crosslinking resin systems which are characterized as providing a brittle and quite rigid crosslinked coating layer. A more flexible crosslinked coating layer is highly advantageous because less care is required to prevent cracking or other degradation of the layer during subsequent processing steps.

The area of the coating not exposed to activating radiation is developable in aqueous alkali solutions such as sodium hydroxide, sodium metasilicate, sodium carbonate, potassium hydroxide, potassium carbonate, ethylene diamine and the like. The preferred developer is a metal hydroxide with concentrations between about 0.5 to 5 percent by volume of alkaline hydroxide in water. When a melamine curing agent is employed in the composition, it is believed the speed of development of the unexposed composition from the surface of the panel is enhanced due to the presence of the melamine.

The compositions of the invention also can be solvent developable in suitable organic developers including polar solvents such as alcohols and glycol ethers and mixtures thereof. Specific suitable organic developers include gamma-butyrolactone and propoxy propanol.

After development of the image, the composition layer is typically characterized by a partial cure leaving the substrate salvageable if any mistakes have been made. Should the patterned coating layer be found faulty, the layer should be strippable using an aqueous alkaline solution or suitable organic solvents.

A post-development thermal cure is desirable to achieve full thermal and electrical soldermask properties in the developed negative tone patterned image. This cure is suitably conducted at a temperature of about 120° to 160° C. for a period of time between about 20 and 90 minutes. The thermal cure hardens unreacted components and can enhance adhesion of the coating layer to the substrate. If a curing agent is present in the composition, this thermal cure also can result in hardening of the curing agent with other components of the composition. The curing agent also can further enhance adhesion of the imaged coating layer to the substrate. Optionally, the coating layer may be post-development and/or post-thermal cure exposed to UV radiation, for example when certain types of epoxy or acrylate resins are present in the composition. The thermal cure will impart solder resistance to the composition coating layer. Thus the cured composition can be used as a permanent dielectric coating. It should be clear that applications of the resist compositions of the invention include selective plating or etching of substrate areas bared of the coating composition upon development in accordance with procedures well known in the art, including procedures disclosed in the above incorporated W. Deforest, *Photoresist Materials and Processes*, and *Printed Circuits Handbook* by Coombs. Thus, in addition to the manufacture of printed circuits and printed circuit boards, the photoimageable compositions of the invention will have utility in the manufacture of printing plates, chemical milling or as a resist in the manufacture of integrated circuits.

The following Examples are illustrative of the invention, but are not to be construed as limiting the invention to the specific embodiments disclosed. The novolak resins used in the compositions of the Examples were a cresol-formaldehyde condensate having a molecular weight (weight average) of about 11,000 daltons. The poly (vinylphenol) resins used in the compositions of the Examples had a molecular weight (weight average) of about 5200.

EXAMPLE 1

A coating formulation in accordance with the invention was prepared by admixing the following components of the indicated amounts:

| Components | Amounts |
| --- | --- |
| Resin binder<br>Novolak | 10.02 g |
| Crosslinker material<br>EPON Resin 828 (epoxy resin available from Shell Chemical Co.) | 6.53 g |
| Photobase generator<br>o-Nitrobenzyl N-cyclohexyl carbamate | 1.05 g |
| Curing agent<br>Cymel 300 (melamine resin available from American Cyanamid) | 3.27 g |
| Sensitizer<br>2-Ethyl-9,10-dimethoxyanthracene | 0.24 g |
| Dye<br>Orasol Blue (available from Ciba-Geigy) | 0.06 g |
| Acrylate polymer<br>Modaflow (polyacrylate available from Monsanto) | 0.43 g |
| Solvent | |
| Propylene glycol methyl ether | 17.42 g |
| Dipropylene glycol monomethyl ether acetate | 4.35 g |
| Filler | 7.13 g |
| TALC (inert filler available from Cyprus Chem.) | |

Under a yellow light precleaned copper clad laminated panels (11 inches×7.5 inches) were coated with the above formulation with a #65 Meier rod and dried for about 20 to 30 minutes at 95° C. The thickness of the photosensitive layer on the copper clad panels was about 1 mil. The board was then imaged through a polyester phototool using a 5000 W high pressure broad band light source and an exposure dose of about 1–3 J/cm$^2$. The exposed panels were cut into two half-size (5.5 inches×7.5 inches) panels. One was subjected to heat for about 15 minutes at 95° C. prior to development, and the other was immediately developed using a 0.366N aqueous sodium hydroxide solution to yield good quality negative-tone relief images on each exposed panel.

EXAMPLES 2 to 5

The same formulation and process were used as in Example 1 above except the formulation was changed as follows: 2-ethyl-9,10-dimethoxyanthracene was replaced by 9-methanol anthracene in Example 2, and by phenothiazine in Example 3, and by 10-methylphenothiazine in Example 4, and by 2-isopropyl thioxanthone in Example 5.

In each of Examples 2–5, aqueous development of the composition coating layer yielded good quality negative-tone relief images.

EXAMPLES 6 TO 10

The same formulation and process were used as in Example 1 except the formulation was changed as follows: o-nitrobenzyl N-cyclohexyl carbamate was replaced by:

2-Hydroxyl-2-phenylacetophenone N-cyclohexyl carbamate in Example 6;

Dibenzoin isophorone dicarbamate in Example 7;

3,5-Dimethoxybenzyl N-cyclohexyl carbamate in Example 8;

N-Cyclohexyl p-toluene sulfonamide in Example 9; and

N-Cyclohexyl-2-naphthalene sulfonamide in Example 10.

In each of Examples 6–10, aqueous development of the composition coating layer yielded good quality negative-tone relief images.

EXAMPLE 11

A coating formulation in accordance with the invention was prepared by admixing the following components of the indicated amounts:

| Components | Amounts |
| --- | --- |
| Resin binder<br>Poly(vinylphenol) | 9.20 g |
| Crosslinker material<br>EPON Resin 828 (Shell Chemical Co.) | 6.53 g |
| Photobase generator<br>Dibenzoin isophorone dicarbamate | 1.66 g |
| Curing agent<br>Cymel 300 (American Cyanamid) | 3.00 g |
| Sensitizer<br>2-Ethyl-9,10-dimethoxyanthracene | 0.24 g |

-continued

| Components | Amounts |
| --- | --- |
| Dye<br>Orasol Blue (Ciba-Geigy) | 0.06 g |
| Acrylate polymer<br>Modaflow (Monsanto) | 0.42 g |
| Solvent | |
| Propylene glycol methyl ether | 12.80 g |
| Dipropylene glycol monomethyl ether acetate | 3.20 g |
| Filler<br>TALC (Cyprus Chem.) | 6.00 g |

This formulation was coated, imaged, and developed as described in Example 1 above to yield a good quality negative-tone relief image.

EXAMPLE 12

Another coating formulation in accordance with the invention was prepared by admixing the following components of the indicated amounts:

| Components | Amount |
| --- | --- |
| Resin binder<br>Novolak | 2.25 g |
| Crosslinker material<br>Methylenedianiline Bismaleimide | 0.36 g |
| Photobase generator<br>Dibenzoin isophorone dicarbamate | 0.06 g |
| Solvent<br>Diglyme | 8.25 g |

This coating formulation was coated, dried, and exposed as described in Example 1 above. After exposure (as described in Example 1 above), the imaged coating layer was heated for 15 minutes at 95° C., and then the cooled panel was developed in 0.4N NaOH aqueous solution to yield a good quality negative-tone relief image. The imaged coating layer also can be suitably developed with 0.4N NaOH solution that contains about 5 weight percent isopropyl alcohol, or the coating layer may be developed with an organic solvent such as isopropyl alcohol.

EXAMPLE 13

A coating formulation in accordance with the invention was prepared by admixing the following components of the indicated amounts:

| Components | Amounts |
| --- | --- |
| Resin binder<br>Novolak | 9.20 g |
| Crosslinker material<br>Methylenedianiline Bismaleimide | 1.00 g |
| Photobase generator<br>Dibenzoin isophorone dicarbamate | 1.66 g |
| Curing agent<br>Cymel 300 (American Cyanamid) | 3.00 g |
| Sensitizer<br>2-Ethyl-9,10-dimethoxyanthracene | 0.24 g |
| Dye<br>Orasol Blue (Ciba Geigy) | 0.06 g |
| Acrylate polymer<br>Modaflow (Monsanto) | 0.42 g |
| Solvent | |
| Propylene glycol methyl ether | 12.80 g |

-continued

| Components | Amounts |
| --- | --- |
| Dipropylene glycol monomethyl ether acetate | 3.20 g |
| Filler<br>TALC (Cyprus Chem.) | 6.00 g |

The formulation was coated, dried and exposed as described in Example 1, and development carried out according to the procedures of Example 12 to yield good quality negative-tone relief images.

The foregoing description of the invention is merely illustrative thereof, and it is understood that variations and modifications can be effected without departing from the scope or spirit of the inventions as set forth in the following claims.

What is claimed is:

1. An aqueous developable negative acting photoimageable resist composition that undergoes photobase-initiated hardening to produce a negative relief image upon exposure and development, the composition comprising an organic photobase generator compound, an aqueous base soluble resin binder selected from the group consisting of a novolak resin, a poly(vinylphenol) resin, a resin containing phenolic units and cyclic alcohol units, an acrylic resin, a resin having acrylic and phenolic units and a blend of an acrylic resin with a phenolic resin, and a compound that crosslinks with the resin binder in the presence of a base, said photobase generator compound being present in an amount sufficient to crosslink said compound with said resin binder to enable development of a coating layer of the photoimageable resist composition following exposure to activating radiation, the composition being free of an acid or acid generating material.

2. The composition of claim 1 where the resin binder is an acrylic resin.

3. The composition of claim 1 where the resin binder is a poly(vinylphenol) resin.

4. The composition of claim 1 further comprising a thermal curing agent that differs from said compound that crosslinks with the resin binder in the presence of a base.

5. The composition of claim 4 where the curing agent is a melamine.

6. The composition of claim 4 where the curing agent is an alkoxymethylmelamine.

7. The composition of claim 4 where the curing agent is hexamethoxymelamine.

8. The composition of claim 4 where the curing agent is an aromatic compound comprising one or more allyl substituents.

9. The composition of claim 4 where the curing agent is an allyl phenol.

10. The composition of claim 4 wherein the composition consists essentially of the photobase generator compound, the resin binder, the compound that crosslinks with the resin binder in the presence of a base, and the curing agent.

11. The composition of claim 1 where the compound that crosslinks with the resin binder in the presence of a base has at least one functionality selected from the group consisting of an epoxy group and an electrophilic multiple bond.

12. The composition of claim 1 where the compound that crosslinks with the resin binder in the presence of a base comprises a functionality selected from the group consisting of an alpha,beta-unsaturated ketone, an alpha, beta-unsaturated ester and an alpha,beta-unsaturated amide.

13. The composition of claim 12 where the compound that crosslinks with the resin binder in the presence of a base is a bismaleimide.

14. The composition of claim 1 where the compound that crosslinks with the resin binder in the presence of a base is an epoxy resin.

15. The composition of claim 1 where the photobase generator compound generates an organic amine following exposure to activating radiation.

16. The composition of claim 1 wherein the photobase generator is a neutral compound.

17. The composition of claim 1 where the photobase generator is selected from the group consisting of carbamates, O-carbamoylhydroxylamines, O-carbomyloximes, aromatic sulfonamides, alpha-lactams, and N-(2-arylethylenyl)amides.

18. The composition of claim 1 where the exposure of a coating layer of the composition to patterned activating radiation photodecomposes the photobase generator compound to provide a base and a latent image in the coating layer.

19. The composition of claim 1 in the form of a dry film.

20. An aqueous developable negative-acting photoimageable resist composition that undergoes photobase-initiated hardening to produce a negative relief image upon exposure and development, the composition comprising an aqueous base soluble resin binder selected from the group consisting of novolak resins and poly(vinylphenol) resins, a photobase generator compound in an amount sufficient to crosslink said compound with said resin binder to enable development of a coating layer of the photoimageable resist coating following exposure to activating radiation, and a compound that crosslinks with the resin binder in the presence of a base in an amount sufficient to crosslink said compound with said resin binder, the crosslinking compound comprising one or more epoxy groups, said composition being free of an acid or an acid generating material.

21. The composition of claim 20 further comprising a thermal curing agent that differs from said compound that crosslinks with the resin binder in the presence of a base.

22. The composition of claim 21 where the curing agent is a melamine.

23. The composition of claim 21 where the curing agent is a mixture of an allyl phenol and a melamine.

24. The composition of claim 20 where the resin binder is a novolak resin.

25. The composition of claim 20 where the photobase generator compound generates an organic amine following exposure to activating radiation.

26. The composition of claim 20 wherein the photobase generator is a neutral compound.

27. The composition of claim 20 where the exposure of a coating layer of the composition to patterned activating radiation photodecomposes the photobase generator compound to provide a base and a latent image in the coating layer.

28. An aqueous developable negative-acting photoimageable resist composition that undergoes photobase-initiated hardening to produce a negative relief image upon exposure and development, the composition comprising an aqueous base soluble resin binder selected from the group consisting of novolak resins and poly(vinylphenol) resins, a photobase generator compound that yields an organic base upon exposure to activating radiation in an amount sufficient to crosslink said compound with said resin binder to enable development of a coating layer of the photoimageable resist coating following exposure to activating radiation, and a compound that crosslinks with the resin binder in the presence of an organic base in an amount sufficient to enable development of a coating layer of the photoimageable resist coating following exposure to activating radiation, the crosslinking compound comprising one or more electrophilic multiple bonds groups and being free of an acid or an acid generating material.

29. The composition of claim 28 further comprising a thermal curing agent that differs from said compound that crosslinks with the resin binder in the presence of a base.

30. The composition of claim 29 where the curing agent is an allyl phenol.

31. The composition of claim 29 where the curing agent is a melamine.

32. The composition of claim 29 where the curing agent is a mixture of an allyl phenol and a melamine.

33. The composition of claim 26 where the crosslinking compound comprises a functionality selected from the group consisting of alpha, beta-unsaturated ketones, alpha,beta-unsaturated esters and alpha,beta-unsaturated amides.

34. The composition of claim 28 where the crosslinking compound is a bismaleimide.

35. The composition of claim 28 where the photobase generator compound generates an organic amine following exposure to activating radiation.

36. The composition of claim 28 where the exposure of a coating layer of the composition to patterned activating radiation photodecomposes the photobase generator compound to provide a base and a latent image in the coating layer.

* * * * *